(12) United States Patent
Kane et al.

(10) Patent No.: US 7,851,987 B2
(45) Date of Patent: Dec. 14, 2010

(54) COLOR ELECTRO-LUMINESCENT DISPLAY WITH IMPROVED EFFICIENCY

(75) Inventors: Paul J. Kane, Rochester, NY (US); Michael E. Miller, Honeoye Falls, NY (US)

(73) Assignee: Eastman Kodak Company, Rochester, NY (US)

( * ) Notice: Subject to any disclaimer, the term of this patent is extended or adjusted under 35 U.S.C. 154(b) by 928 days.

(21) Appl. No.: 11/694,176

(22) Filed: Mar. 30, 2007

(65) Prior Publication Data
US 2008/0238829 A1    Oct. 2, 2008

(51) Int. Cl.
*H01J 1/62* (2006.01)
*H01J 63/04* (2006.01)

(52) U.S. Cl. .................. 313/500; 313/498; 313/506

(58) Field of Classification Search ......... 313/498–512; 257/98–100; 445/24–25
See application file for complete search history.

(56) References Cited

U.S. PATENT DOCUMENTS

| | | | |
|---|---|---|---|
| 7,012,588 B2 | 3/2006 | Siwinski | |
| 2002/0070681 A1* | 6/2002 | Shimizu et al. | 315/246 |
| 2004/0239243 A1* | 12/2004 | Roberts et al. | 313/512 |
| 2004/0264193 A1* | 12/2004 | Okumura | 362/276 |
| 2005/0184638 A1* | 8/2005 | Mueller et al. | 313/485 |
| 2005/0194608 A1* | 9/2005 | Chen | 257/100 |
| 2005/0212728 A1 | 9/2005 | Miller et al. | |
| 2006/0012987 A9* | 1/2006 | Ducharme et al. | 362/231 |
| 2006/0105198 A1 | 5/2006 | Spindler et al. | |
| 2007/0291467 A1* | 12/2007 | Nagai et al. | 362/84 |

FOREIGN PATENT DOCUMENTS

WO          00/11728          3/2000

OTHER PUBLICATIONS

"Quantum Dot Light Emitting Devices for Pixelated Full Color Displays", by Bulovic and Bawendi, SID 2006 Digest, ISSN0006-6966X/06/3702.
"Suggested Optimum Primaries and Gamut in Color Imaging", by William A. Thornton, COLOR Research and Application, copyright 2000 by John Wiley & Sons, Inc.

* cited by examiner

*Primary Examiner*—Bumsuk Won
*Assistant Examiner*—Kevin Quarterman
(74) *Attorney, Agent, or Firm*—Stephen H. Shaw

(57) ABSTRACT

A full-color electroluminescent display with improved efficiency and increased color gamut that includes substantially complementary yellow and blue light-emitting elements, the chromaticity coordinates of which define the endpoints of a line that intersects a Planckian locus within the interval $0.175<=u'<=0.225$ within the Commission Internationale de l'Eclairage (CIE) 1976 u'v' chromaticity space. Also included in the display is a green light-emitting element of spectrum having a dominant wavelength between 500 nm and 540 nm and a full width, half maximum spectral bandwidth of 50 nm or less; and a red light-emitting element.

17 Claims, 14 Drawing Sheets

COLOR ELECTRO-LUMINESCENT DISPLAY WITH IMPROVED EFFICIENCY

FIELD OF THE INVENTION

The present invention relates to inorganic LED devices employing quantum dot light-emitting layers. Specifically, the invention relates to inorganic LED displays employing quantum dot light-emitting elements.

BACKGROUND OF THE INVENTION

In recent years, light-emitting devices have included quantum-dot emitting layers to form large area light emission. One of the predominant attributes of this technology is the ability to control the wavelength of emission, simply by controlling the size of the quantum dot. As such, this technology provides the opportunity to relatively easily design and synthesize the emissive layer in these devices to provide any desired dominant wavelength, as well as control the spectral breadth of emission peaks. This fact has been discussed in a paper by Bulovic and Bawendi, entitled "Quantum Dot Light Emitting Devices for Pixelated Full Color Displays" and published in the proceedings of the 2006 Society for Information Display Conference. As discussed in this paper, differently sized quantum dots may be formed and each differently-sized quantum dot will emit light at a different dominant wavelength. This ability to tune emission provides opportunities for creating very colorful light sources that employ single color emitters to create very narrow band and, therefore, highly saturated colors of light emission. This characteristic may be particularly desirable within the area of visual displays, which typically employ a mosaic of three different colors of light-emitting elements to provide a full-color display.

Within the information display application space, devices are desired to deliver a large color gamut with high efficiency. Two important measures of display efficiency are commonly used. First, luminous efficacy measures the light generated that is perceived by the eye as influencing the sensation of brightness, compared to the overall radiant flux. That is, it is the ratio of luminous flux to radiant flux. This quantity has units of lumens/Watt, where the Watts refer to optical power. Second, luminous efficiency measures the same luminous flux, but compared to the input electrical power needed to generate the output light. Its units are also lumens/Watt, where now the Watts refer to electrical power. The two requirements of large color gamut and high efficiency are often in conflict with one another, due to the fact that in order to expand the color gamut of the display, the red and blue emitters must often be shifted towards very short and very long wavelengths, respectively. The human eye is much less sensitive to these wavelengths than to wavelengths of light near the center of the visible spectrum. This loss of sensitivity to energy at the extremes of the visible spectrum occurs because luminous flux is calculated by cascading the eye sensitivity function with the radiant power spectrum of light emission. FIG. 1 shows the efficiency function of the human eye, which shows the percent efficiency of the eye in converting energy at each wavelength within the visible spectrum to an increase in perceived brightness. As this figure shows, the human eye is most sensitive to energy with a wavelength of between 550 and 560 nm 2, but much less sensitive to a very short wavelength 4 or very long wavelength 6 energy within the visible spectrum.

Although the loss of display efficiency that occurs as the color gamut of the display is increased can be largely explained by this discussion of the red and blue emitters. The placement of the green emissive element is also quite important. FIG. 2 shows a 1931 Commission Internationale de l'Eclairage (CIE) chromaticity diagram having two triangles. The first triangle 8 depicts the color gamut of a display having a green emissive element 16 near 533 nm, and blue 18 and red 14 emissive elements. The second triangle 10 depicts a larger color gamut that may be achieved by shifting the dominant wavelength of a narrowband green emitter to 525 nm. As is readily visible, the color gamut triangle 10 is significantly larger than the color gamut triangle 8; in fact the areas within this color space are 0.18 and 0.19 for triangle 8 and triangle 10, respectively. However, referring again to FIG. 1, it may be observed that shifting the green primary from 533 nm to 525 nm, which provides a larger color gamut, reduces the efficiency at which the human eye converts radiant power to perceived brightness from 90% to only 79%.

Numerous methods for improving the overall efficiency of a display device have been discussed in the literature. One such method is to simply select the RGB primaries to provide high efficiency while at the same time providing an "optimal gamut" as suggested by William A. Thornton in a paper entitled "Suggested Optimum Primaries and Gamut in Color Imaging" and published in Color Research and Application, vol. 25, No. 4. In this paper, the author suggests selecting the primaries of the display device to match the "prime colors" for the human visual system. As the authors suggests, this would establish a system having emitters with peak wavelengths of 450, 530, and 610 nm for the blue, green, and red emissive elements, respectively. This approach supposedly allows the display to provide maximum peak brightness for a given input energy, if it is assumed that the radiant efficiency of each of the emitters is equivalent. Unfortunately, this approach limits the color gamut of the display. In fact, the color gamut triangle 8 in FIG. 2 is obtained when the display uses light-emitting elements having these same peak wavelengths, each light-emitting element having a 30 nm bandwidth. Of further concern with this approach is that the red primary is particularly desaturated and the color of this primary may be more accurately described as orange rather than red. Therefore, while the approach described by Thornton does provide a display with good energy efficiency, it would not provide a display with a particularly good visual appearance.

A second method, which has been discussed within the organic light emitting diode art, involves the addition of more efficient primaries to the typical three primary systems. For instance Burroughes in WO/0011728, entitled "Display Devices" describes an OLED system having red, green, and blue light emissive elements and at least one further light emissive element for emitting a color to which the human eye is more sensitive than the emission color of at least one of the red and blue emitters. Unfortunately, Burroughes fails to recognize that in most applications, it is particularly important to render white with high efficiency, a fact that is discussed by Miller et al in US Patent Application US20050212728A1, entitled "Color OLED display with improved power efficiency". As this application discusses, the optimal power benefit when adding additional narrowband emitters to the display requires the addition of at least two additional light-emitting elements; one for emitting yellow and one for emitting cyan light. Therefore, in devices such as these, in which additional saturated color primaries are added, it is typically necessary to include at least two additional emitters to achieve the maximum gains in power efficiency. However, the addition of each additional primary increases the manufacturing cost of the display device since additional elements must be formed and patterned for each colored light-emitting element, requiring more precise patterning technology to allow these additional features to be patterned within the same plane as the original three emitting elements. Image quality of the display is also often sacrificed, as there is a need for a total of five emissive elements per pixel, two of which will often be inactive at any point in time.

Another approach discussed in the organic light emitting diode literature is to add a single, highly efficient white emitting element to the display device as discussed by Siwinski in U.S. Pat. No. 7,012,588, entitled "Method for saving power in an organic electro-luminescent display using white light emitting elements". While disclosures such as this one discuss the use of a white light-emitting element to improve the efficiency of the display system, they do not provide teaching as to the desired spectra of the white emitter, other than to state that it is broadband or emits a white or an in-gamut color. Further, disclosures within this area which do discuss the spectral content of such a white emitter, such as US Patent Application 2006 0105198 by Spindler et al., entitled "Selecting white point for OLED devices" discuss the formation of white light-emitting elements using organic materials with broad emission spectra, typically having a bandwidth of greater than 90 nm. As noted earlier, the characteristics of organic white light emitting elements are limited to the characteristics that are available from organic emissive materials. The broadband response of these materials limits their maximum efficiency as energy emission occurs across a broad bandwidth range, including wavelengths to which the human eye is not particularly sensitive.

The improvement of both luminance efficiency and color gamut requires an understanding of the emitter characteristics and how they will determine the available gamut. While the human eye efficiency curve of FIG. 1 and the CIE chromaticity diagram of FIG. 2 provide fundamental information about the relative sensitivity of the eye to different wavelengths, and how the visual system perceives the range of wavelengths as different colors, they do not immediately tell us how to co-optimize a system's gamut and efficiency. For example, FIG. 1 directly demonstrates the relative sensitivity of the eye to monochromatic emitters as a function of wavelength. In practice, we must almost always deal with emitters that have spectra of finite width, as illustrated in FIG. 3. Here a model emitter spectrum 20 having a Gaussian profile is shown, normalized to a peak value 24 of 1.0 at the corresponding dominant wavelength 26, and having a full-width-half-maximum (FWHM) value 22, which measures the width of the spectrum at the 0.5 response level. For quantum dot type emitters, typical values of FWHM are on the order of 30 nm. For narrowband or broadband emitters, i.e. emitters having a small or larger value of FWHM, the relative brightness of the emitter to the eye is characterized by the luminous efficacy, as explained above. This amounts to multiplying the curves in FIGS. 1 and 3 together, with the curve in FIG. 3 centered at the proper wavelength and scaled to the proper width, and then integrating the area under the resulting curve. All of this answers the question of which types of emitters appear brightest to the eye.

The CIE x,y chromaticity diagram (FIG. 2) has a spectrum locus 12, which is the line that represents the position of all visible monochromatic sources in the color space. The entire area within this horseshoe shape represents the color gamut of a hypothetical array of monochromatic emitters (near zero FWHM) of continuously variable peak wavelength. On the perimeter lie all the "pure" or highest saturation colors, while within the perimeter lie colors of lesser saturation, which could be formed by mixing any of the monochromatic sources on the perimeter. Whites or neutral colors are well inside the perimeter, but not necessarily in the geometric center. It is known that broadband emitters will have a reduced color gamut as compared to monochromatic, or single-wavelength emitters. While the chromaticity diagram reveals how colors mix, and helps to understand the mathematics of color mixing, it does not by itself explain which combinations of sources might be the most efficient ones to produce a given color for a given set of emitters, in particular for emitters of finite bandwidth.

The tradeoff between color gamut and luminance efficiency has not been completely addressed. The optimal placement of additional emitters in the color space to resolve this tradeoff has not been identified. Therefore, there is still a need for a display device with improved color gamut and high luminance efficiency, with a minimum increase in display complexity and manufacturing cost.

SUMMARY OF THE INVENTION

The need is met, according to one embodiment of the present invention, by providing a full-color electroluminescent display with improved efficiency and increased color gamut that includes substantially complementary yellow and blue light-emitting elements, the chromaticity coordinates of which define the endpoints of a line that intersects a Planckian locus within the interval $0.175<=u'<=0.225$ within the Commission Internationale de l'Eclairage (CIE) 1976 u'v' chromaticity space. Also included in the display is a green light-emitting element of spectrum having a dominant wavelength between 500 nm and 540 nm and a full width, half maximum spectral bandwidth of 50 nm or less; and a red light-emitting element.

Another embodiment of the present invention provides a color electroluminescent display system having at least four differently colored light-emitting elements, including substantially complementary yellow and blue light-emitting elements, having chromaticity coordinates that define endpoints of a line that intersects a Planckian locus within the interval $0.175<=u'<=0.225$ within the Commission Internationale de l'Eclairage (CIE) 1976 u'v' chromaticity space. To enable full color for the display a green light-emitting element of spectrum having a dominant wavelength between 500 nm and 540 nm and a full width, half maximum spectral bandwidth of 50 nm or less is included along with a red light-emitting element. A controller, electrically connected to the light-emitting elements, selectively applies a drive signal to the light-emitting elements to preferentially apply the yellow and blue light-emitting elements when forming near-neutral colors to improve the luminous efficiency of the display while maintaining a large color gamut.

DETAILED DESCRIPTION OF THE INVENTION

The invention is directed towards an electroluminescent display device having at least four differently colored light-emitting elements, comprising complementary yellow and blue light-emitting elements, as well as green and red light-emitting elements, wherein the chromaticity coordinates of the complementary yellow and blue light-emitting elements, along with the green light-emitting element, are chosen to provide improved display efficiency and color gamut.

Figure 2:
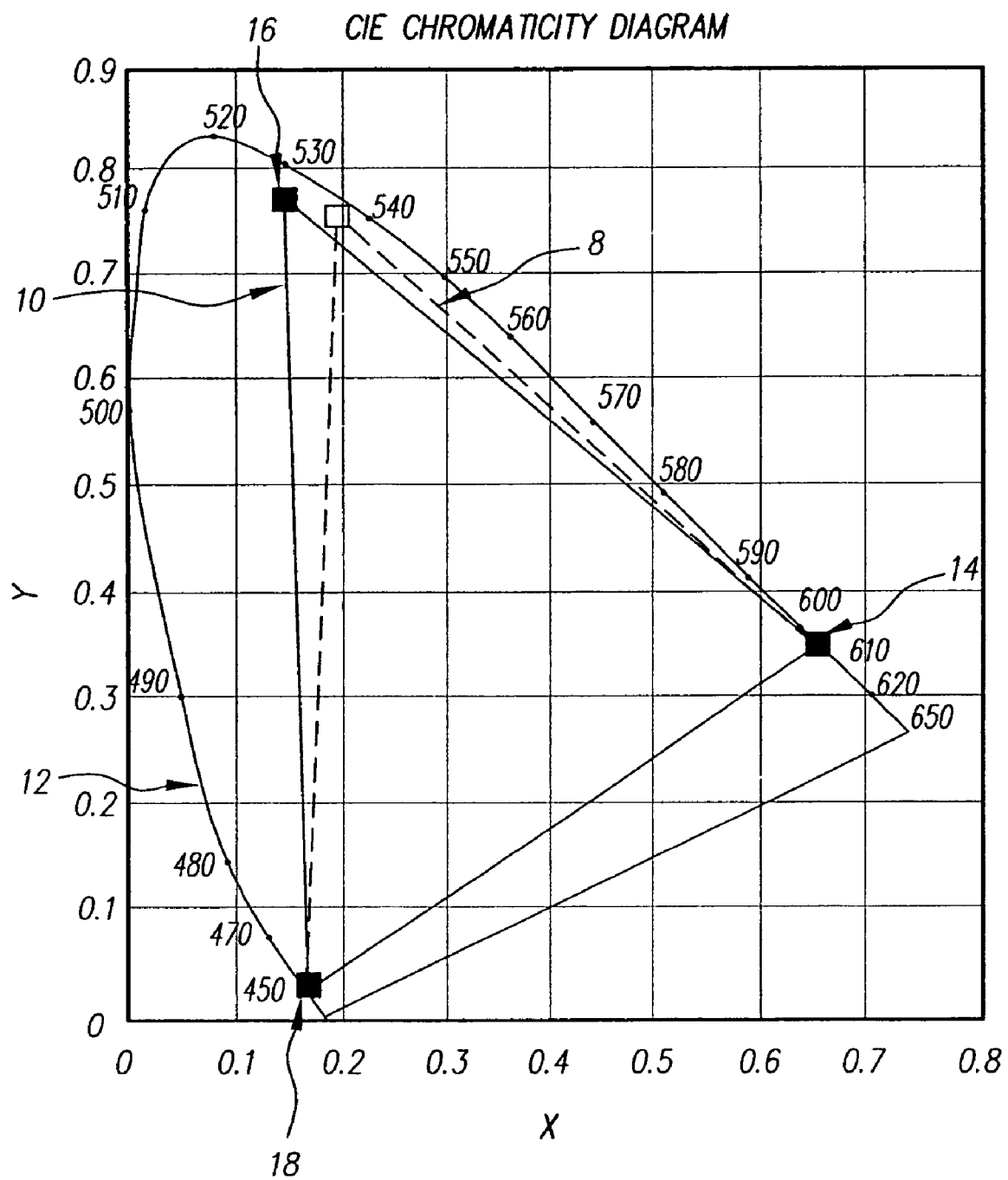
FIG. 2 is a CIE xy chromaticity diagram of two display color gamuts known in the prior art.
Figure 3:
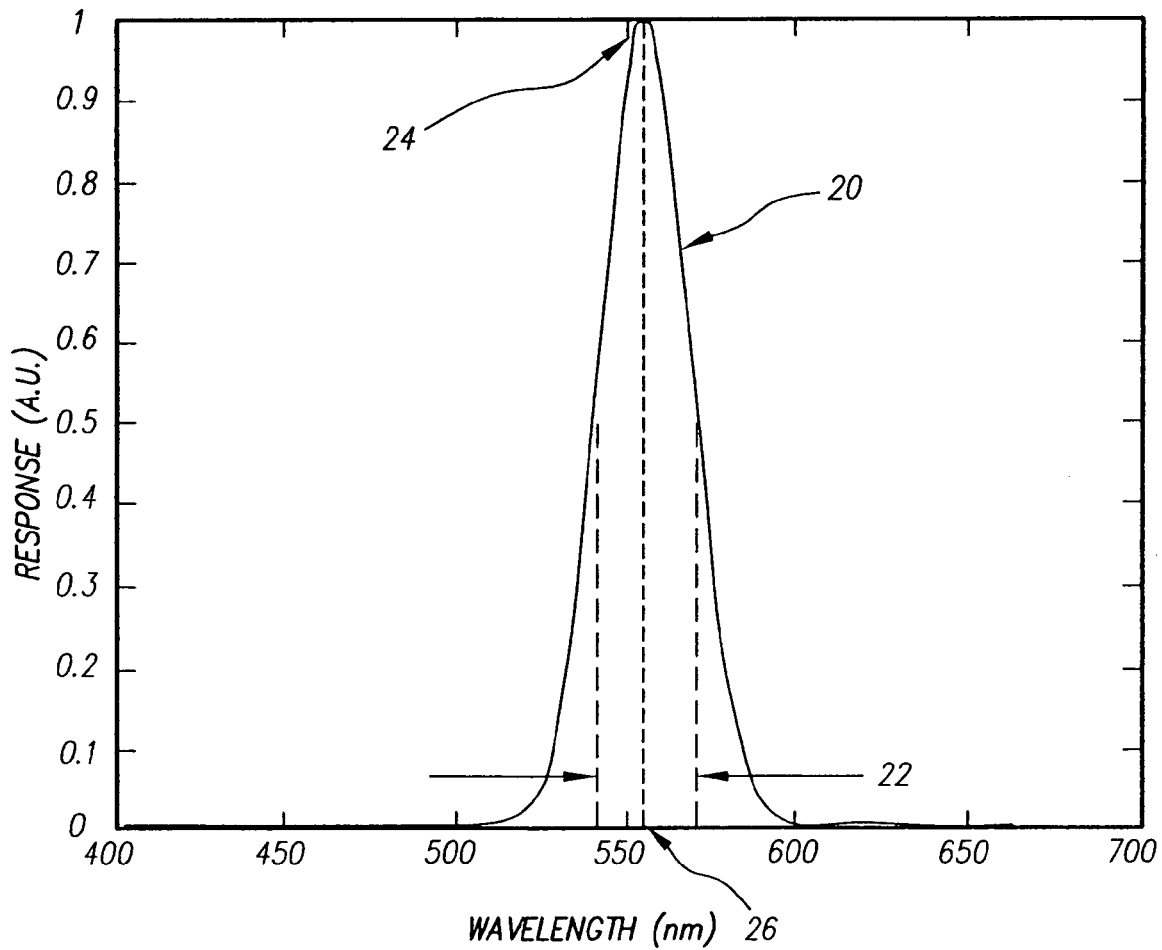
FIG. 3 is a model QD-LED spectral emission curve known in the prior art.
Figure 4:
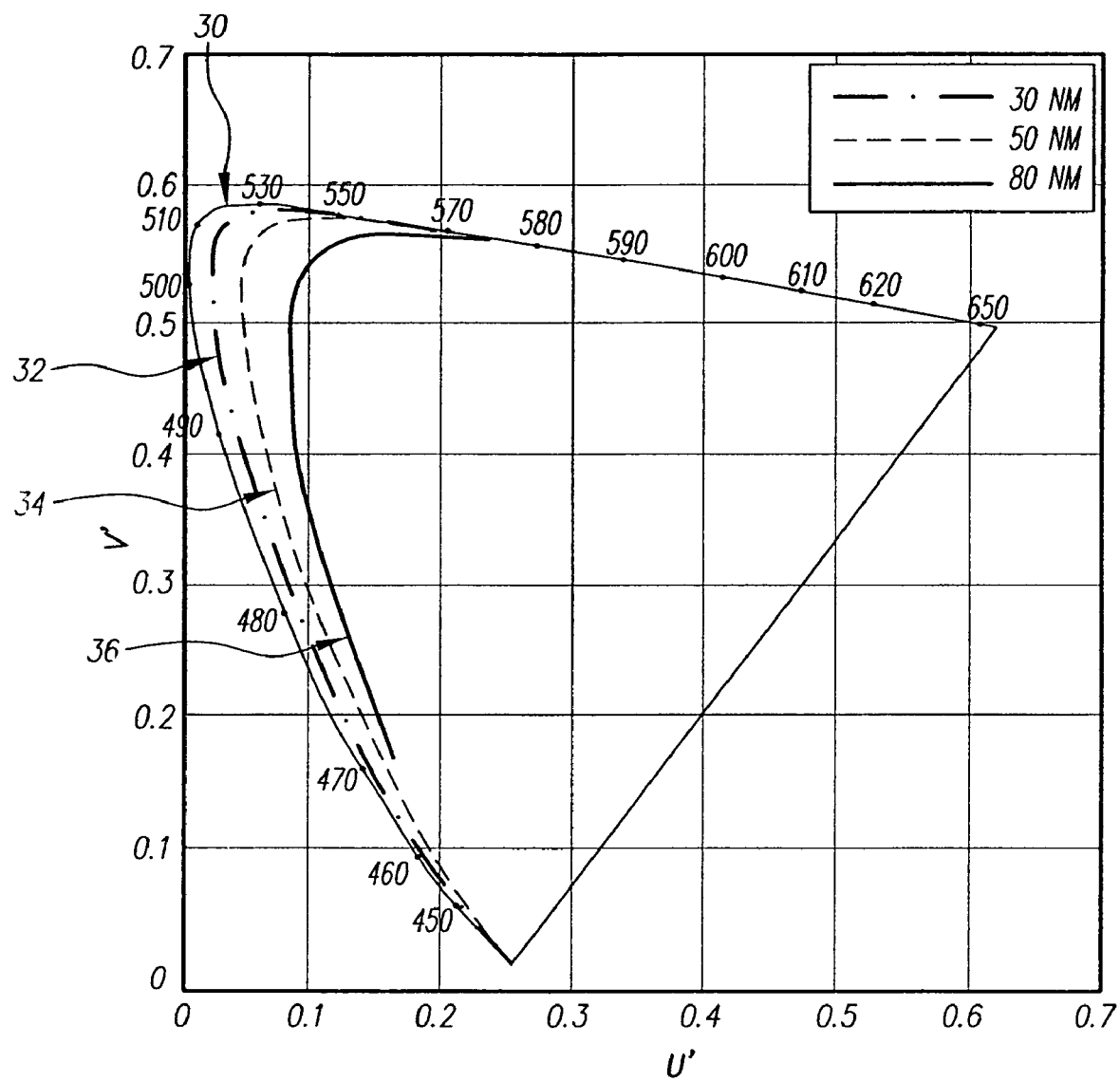
FIG. 4 is a CIE u'v' chromaticity diagram illustrating the u'v' coordinates of a population of quantum dot emitters of continuously varying peak wavelength.

FIG. 4 shows a plot of three curves representing the locus of three hypothetical distributions of emitters in the Commission Internationale de l'Eclairage (CIE) 1976 u' v' chromaticity space. This particular chromaticity space has been used in the plot because of its industry-wide acceptance that it is perceptually uniform. In this plot, the curve 32 shows the locus of a continuum of Gaussian emitters with spectra as in FIG. 3, with a FWHM of 30 nm and dominant wavelength varying over the visible range, in comparison to the spectrum locus 30. The curves 34 and 36 show the locus of similar curves for FWHM values of 50 nm and 80 nm, respectively. These curves demonstrate that while the gamut of available colors is noticeably reduced by a finite bandwidth, as compared to monochromatic sources, for smaller values such as 30 nm the gamut reduction is not severe. In fact, for quantum dot emitters that typically may have FWHM values of 30 nm, the available gamut would be quite improved compared to the prior art as suggested by FIG. 2. Note that a similar curve drawn for another distribution having a FWHM value of 10 nm lies so close to the spectrum locus 30 that it would be nearly indecipherable.

Figure 1:
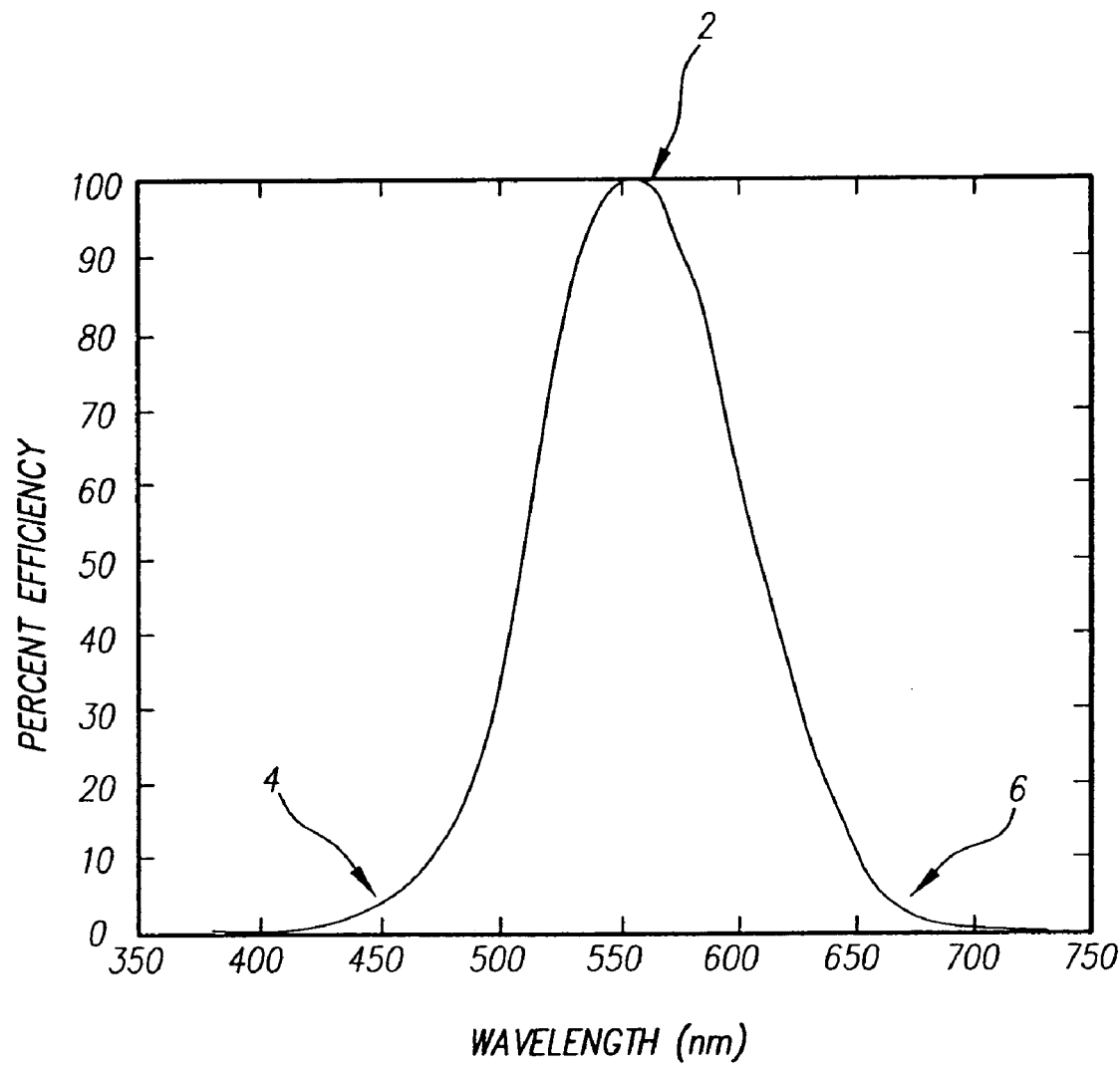
FIG. 1 is an eye sensitivity curve known in the prior art.
Figure 5:
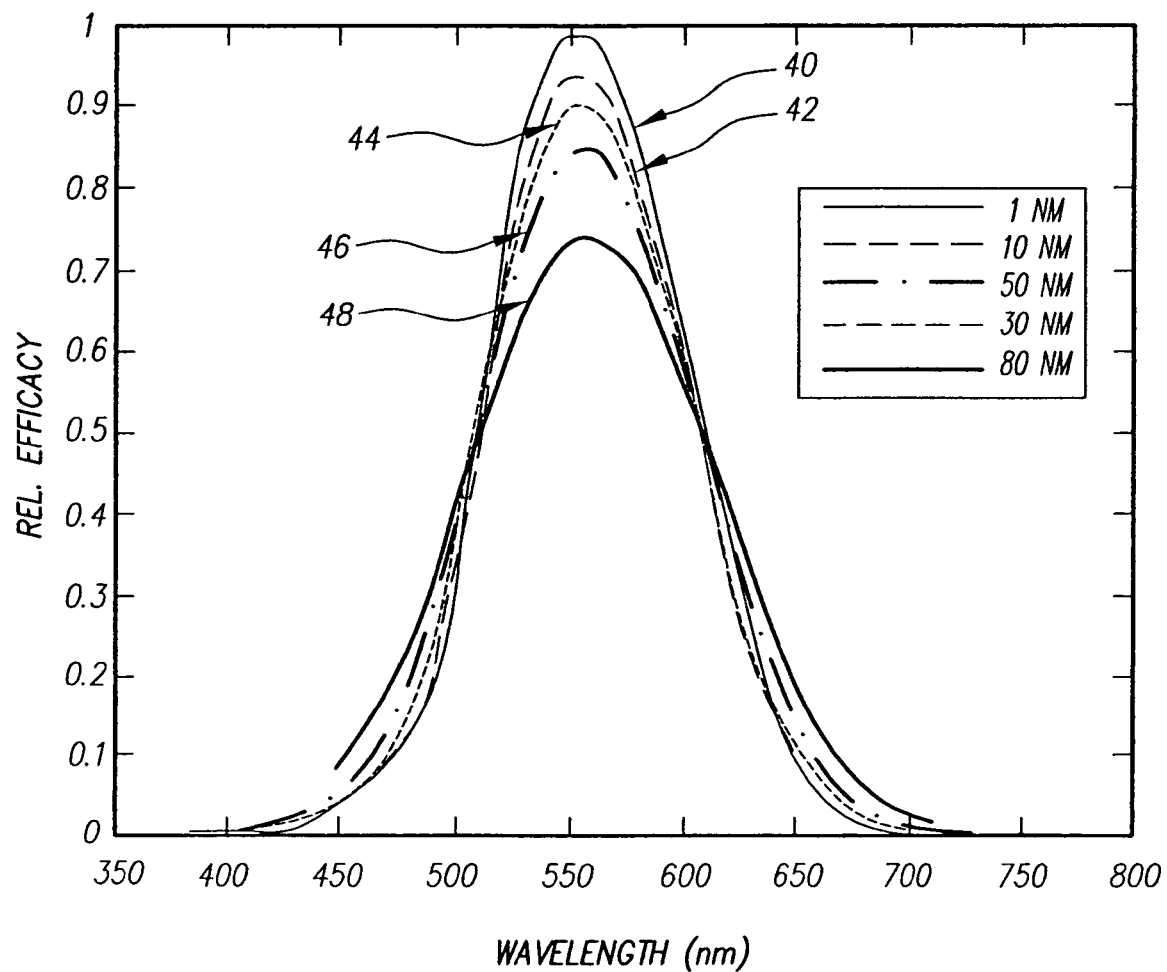
FIG. 5 is a plot of relative luminous efficacy vs. wavelength for a series of model quantum dot emitters.

Next, to determine the best placement of the display emitters in chromaticity space, the luminous efficacy of the emitters must be calculated, and this information combined with the desired color gamut. FIG. 5 shows the relative luminous efficacy vs. dominant wavelength of five hypothetical distributions of emitters, all having spectra as in FIG. 3. The FWHM values of these emitters are 1 nm for curve 40, 10 nm for curve 42, 30 nm for curve 44, 50 nm for curve 46, and 80 nm for curve 48. The relative luminous efficacy is taken as the Y tristimulus value calculated for the spectral curve of a given dominant wavelength and FWHM, divided by the Y tristimulus value of a monochromatic emitter of the same dominant wavelength. As the plot demonstrates, the highest efficacy is found near the peak of the visual sensitivity near 550 nm, as expected. Broadening of the emitter spectra, i.e. larger FWHM values, leads to lower peak and overall efficacy, as energy is spread to wavelengths where the eye is less sensitive, as illustrated in FIG. 1. Therefore in general, broader emitters will lead to both reduced peak efficacy and lower color gamut, since they also produce less saturated colors. Note that in the plot, curve 48 is truncated; due to the relatively large bandwidth, dominant wavelengths beyond certain upper and lower limits lead to emitter spectra that extend well outside the visible range and hence are neither efficient nor good for color gamut. We conclude from FIG. 5 that, assuming equal quantum efficiencies, the most efficient emitters will be those whose dominant wavelengths are as close to the visual peak as possible, and as narrow as practical. They will generate more lumens per Watt of optical power, and thus will be brighter for the same amount of electrical power, at constant quantum efficiency.

Figure 6:
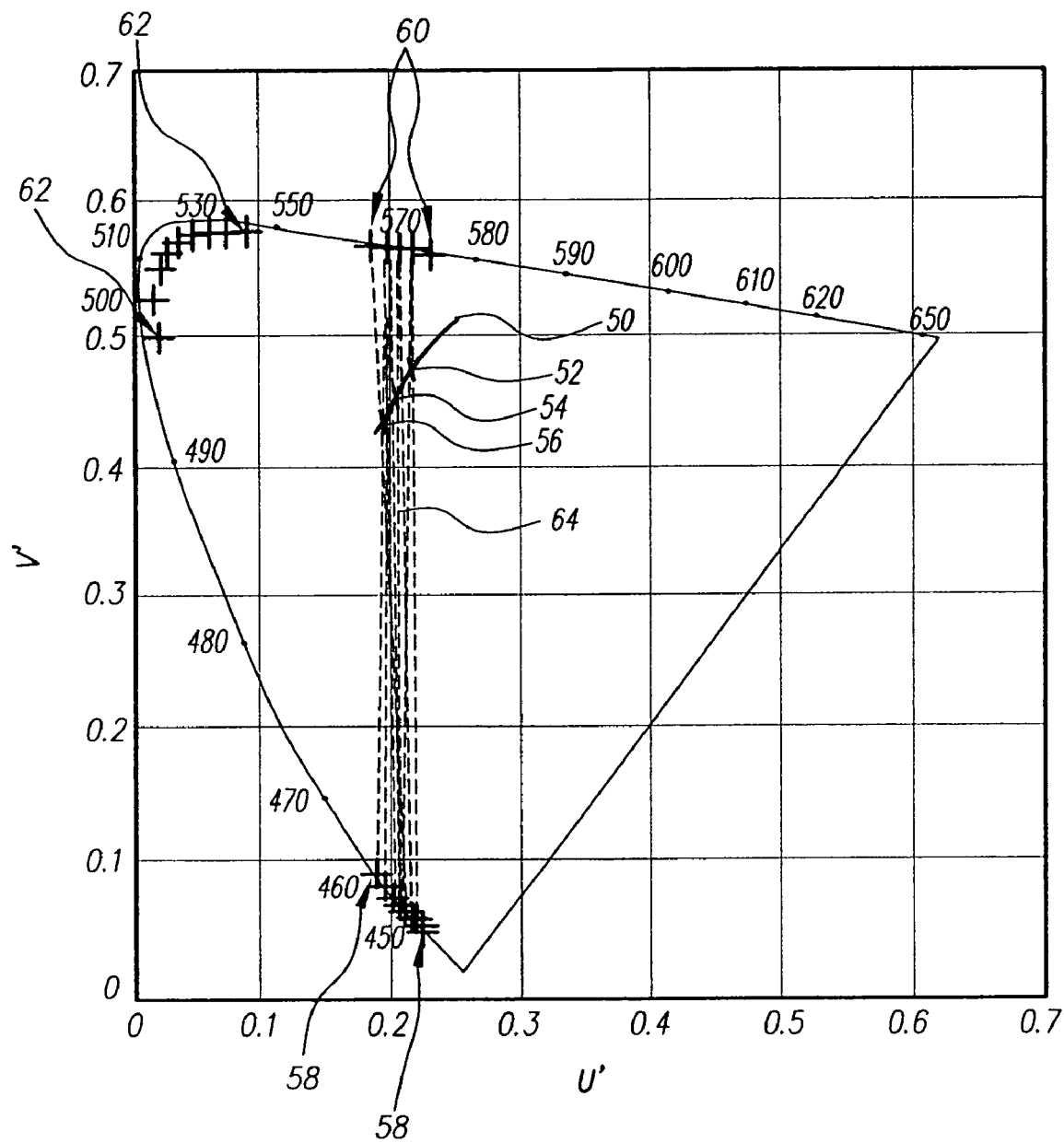
FIG. 6 is a CIE u'v' chromaticity diagram illustrating the positions of blue, green and yellow emitters according to one embodiment of the present invention.

Returning to FIG. 2, it is seen that a green emitter 16 is close to the peak of visual sensitivity, whereas red 14 and blue 18 emitters are not. The lower brightness of the red and green emitters leads to inefficiency in the emission of neutrals or whites. FIG. 6 shows a CIE 1976 u'v' chromaticity diagram illustrating several key areas of color space relating to the present invention. The Planckian locus 50 is a line in this space where near-neutral colors generated by blackbody radiators at a series of temperatures appears. In FIG. 6, this locus has been plotted for blackbody temperatures between 3000K (end with higher v' value) and 10000 K (end with lower v' value). Also shown are the locations of three specific blackbody radiators that are common references for setting the white points of displays, corresponding to 5000K (52), 6500K (54) and 9300K (56). Not only whites, but also grays appear near or on this locus, and many near-neutral or desaturated colors appear very close to this area. The colors in this general area may be formed by mixing triplets of primaries, as in RGB, or by mixing any pair of opposing colors that are connected by a line passing through the color to be formed. For example, a monochromatic yellow-blue pair at dominant wavelengths of roughly 570 nm and 450 nm, in the proper proportion, will produce a white on the locus 50. In another example, a monochromatic cyan-orange pair at dominant wavelengths of roughly 490 nm and 595 nm, in the proper proportion, will also produce a white on the locus 50. If the proportions are correct, both whites will appear the same to the eye. However, the different positions of the dominant wavelengths will lead to different spectral efficacies, and hence different power consumptions in a display.

Calculations performed by the inventors explored a range of model emitters, using the Gaussian curve of FIG. 3 with different values of FWHM, and different ranges of the dominant wavelength, to determine the emitter combinations that produced the lowest relative radiometric power in forming the white points 52, 54 and 56. Specifically, the calculations assumed that a full-white was composed of at least two, and usually three emitters, selected from a population whose dominant wavelengths covered ranges representing four different hues: blue (400 nm-470 nm), green (495 nm-540 nm), yellow (545 nm-580 nm) and red (600 nm-670 nm). Three different FWHM values (30 nm, 50 nm and 80 nm) and the three white points given above were evaluated. In each case, a white of specified color temperature at a simulated luminance of 100 cd/m$^2$ was constructed from three emitters, all with the same specified FWHM. Since the white can be made several ways—for example, using BGY, RGB, or GYR emitters, depending on the white point and dominant wavelength—each triplet was evaluated to determine the proportion of each emitter necessary to match the white, along with the radiometric power expended. The latter quantity is simply the area under the combined emitter curves, each properly scaled. This was repeated for each combination of dominant wavelengths over the ranges indicated. Although many solutions are possible, the results showed that the best solutions were blue-green-yellow triplets. In FIG. 6, the emitters representing the BGY triplets within 2% of the optimum (lowest radiometric power to create a given luminance) are shown as plus signs near the spectrum locus. The green emitters 62 lay within the interval $0 \leq u' \leq 0.1$, while both the blue emitters 58 and the yellow emitters 60 lie within the interval $0.175 \leq u' \leq 0.225$. Also shown are dotted lines 64 connecting the blue-yellow pairs, emphasizing the narrow distribution of these emitters as compared to the distribution of green emitters. This suggests that the solution set is less sensitive to the position of the green emitter, which is consistent with the fact that the proportion of the green emitters is generally much smaller than the blue or yellow, the latter two making up the majority of the light needed to match the white. Therefore there is some degree of freedom in choosing the green emitter. The best performing solutions did not include red emitters, since the positions of the white points and locations of the yellow and blue primaries are such that the white points 52, 54 and 56 are inside the BGY color gamut, and outside the BYR color gamut. Therefore the red is excluded from the formation of neutrals in this case, and may be chosen mostly on the basis of color gamut. Therefore in one embodiment of the present invention, the blue and yellow emitters will be chosen such that a line drawn between the chromaticity coordinates of these two emitters intersects the Planckian Locus within the interval $0.175 \leq u' \leq 0.0.225$, while the green emitter will be chosen to have a dominant wavelength between 500 nm and 540 nm, the latter range resulting in the interval $0 \leq u' \leq 0.1$ in the chromaticity space. The green emitters 62 shown in FIG. 6 represent the case of FWHM equal to 30 nm, which is expected, since again, the narrowest spectra result in the greatest power savings, as well as the best gamut. The cases with FWHM of 50 nm also produce radiant power and gamut within acceptable limits, while the expansion of FWHM to 80 nm results in unacceptably large gamut losses (see FIG. 4) and larger radiant power output. Suitable values of the FWHM can be achieved with quantum dot light-emitting elements, and also with organic light emitting diode (OLED) elements when microcavity structures are employed. It is further worth noting that for the most efficient combinations of blue and yellow emitters, the blue emitter always has a peak wavelength between 440 and 460 nm and the yellow emitter always has a peak wavelength between 565 and 575 nm.

Figure 7:
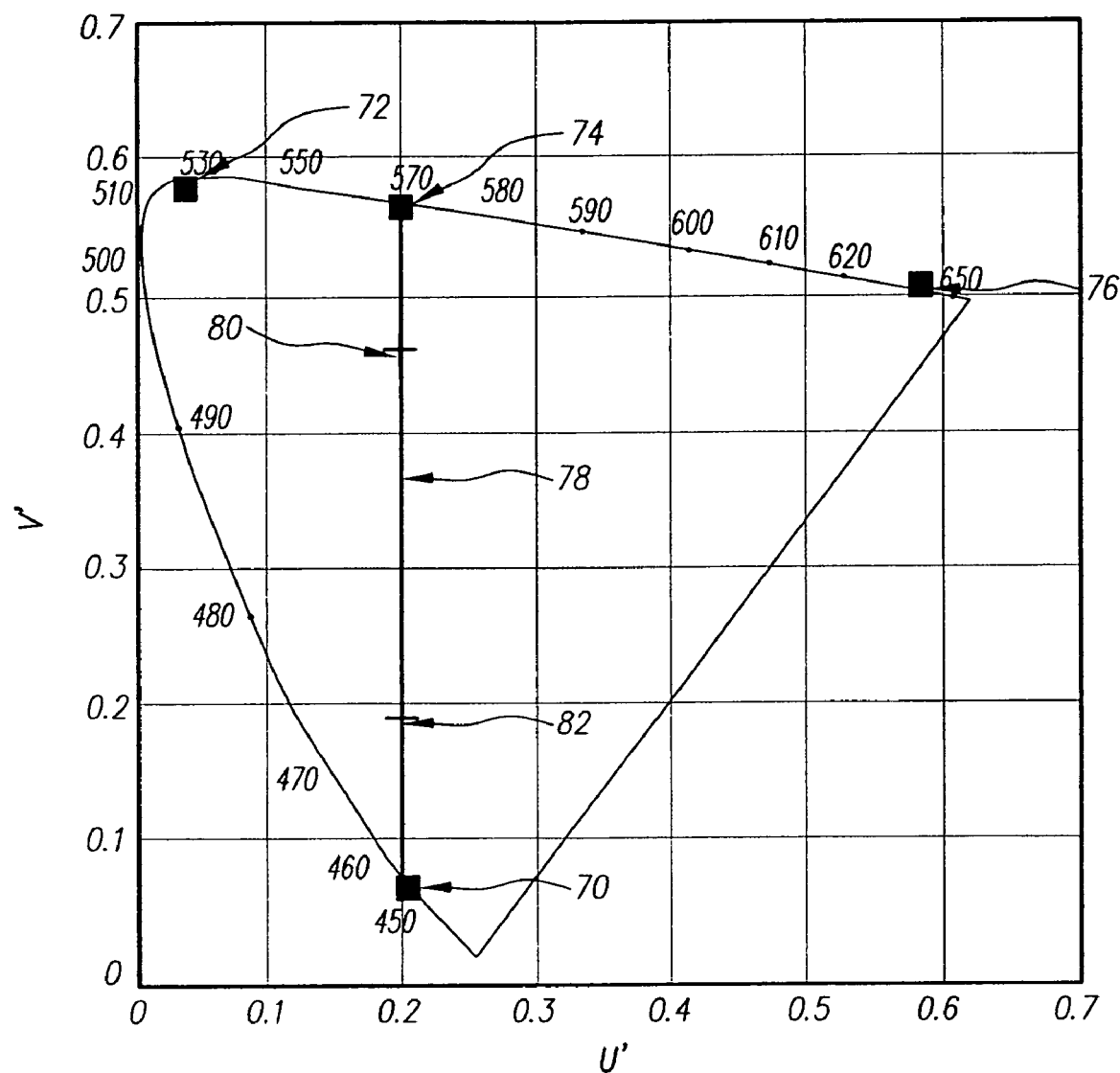
FIG. 7 is a CIE u'v' chromaticity diagram illustrating the positions of blue, green, yellow and red emitters according to one embodiment of the present invention.

In another embodiment of the present invention, the output of four light-emitting elements from an RGYB display is represented in the CIE 1976 u'v' chromaticity diagram shown in FIG. 7. Light-emitting elements corresponding to dominant wavelengths at (70) 450 nm, (72) 525 nm, (74) 570 nm and (76) 650 nm are shown, along with a line 78 connecting the endpoint positions of the blue 70 and yellow 74 elements in the u'v' color space. The line 78 is almost coincident with the vertical line u'=0.2. The points 80 and 82, along with all other points on the line 78, represent colors that can be made by mixing proportions of the yellow 74 and blue 70 emitters, along with a small amount of green 72, since in this case the points 80 and 82 actually lie slightly to the left of the line 78. These colors can also be made by combining red, green and blue in the correct proportions. However, it is the case that all colors along the line 78 are more efficiently made by combinations of yellow and blue, with a minimal amount of green than by any of the other available combinations. For example, the BGY representation of color 80 can be produced using 50% of the radiometric power compared to the RGB combination. In another example, the BGY representation of color 82 can be produced using 83% of the radiometric power compared to the RGB combination. The latter example results in less power savings, since the color to be matched is farther away from the high luminance primaries and is closest to the lowest luminance primary; however there is still a slight savings.

Figure 8:
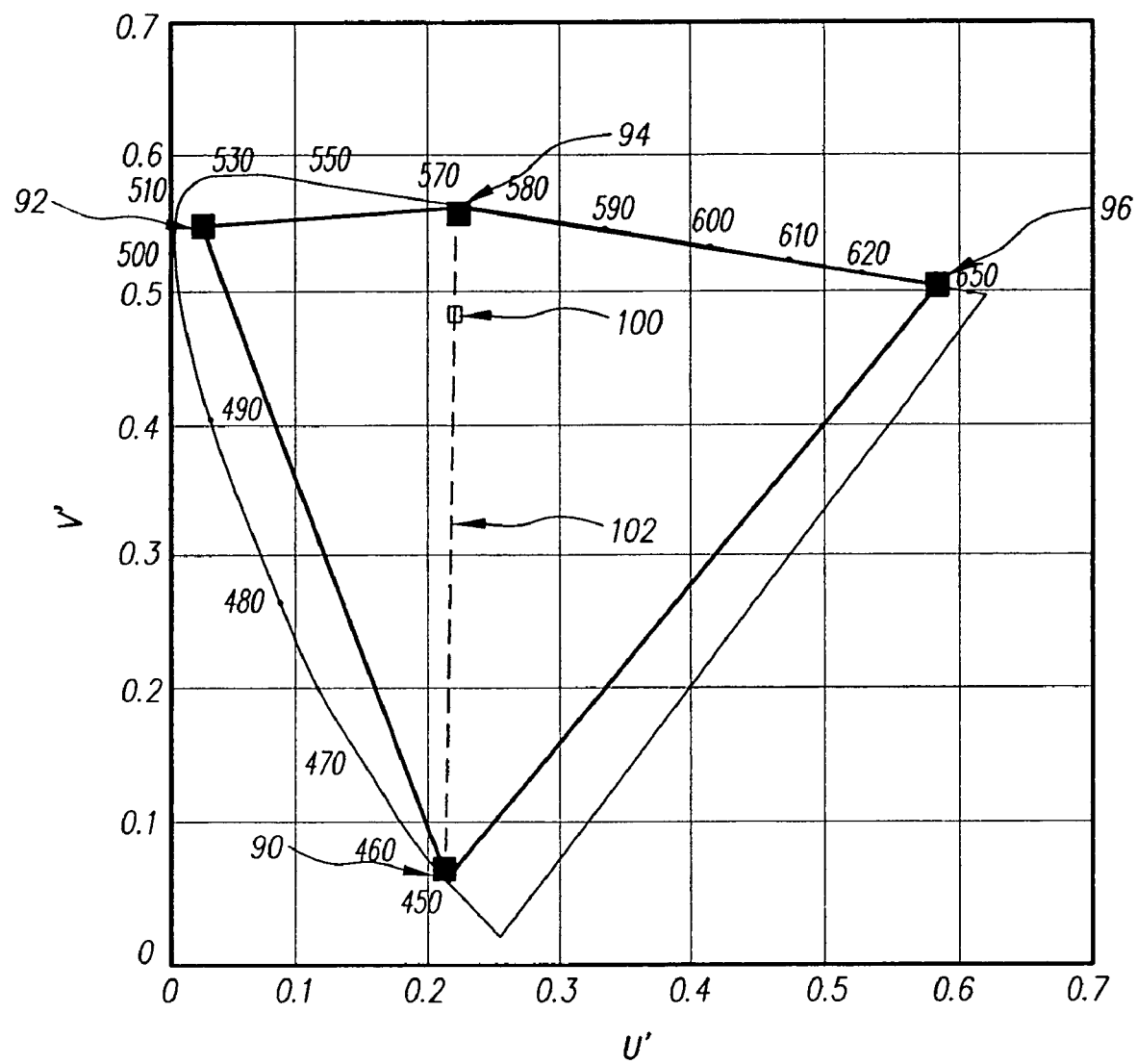
FIG. 8 is a CIE u'v' chromaticity diagram illustrating the positions of blue, green, yellow and red emitters according to a preferred embodiment of the present invention.

In a preferred embodiment of the invention, FIG. 8 shows the output of four light-emitting elements from an RGYB display in a CIE 1976 u'v' chromaticity diagram. Light-emitting elements corresponding to dominant wavelengths at (90) 450 nm, (92) 510 nm, (94) 572 nm and (96) 650 nm are shown, along with a line 102 connecting the endpoint positions of the blue 90 and yellow 94 elements in the u'v' color space. The connecting line 102 lies just to the right of point 100, which represents a practical lower color temperature limit for display white points, corresponding to a blackbody radiator at 5000K. Blackbody temperatures lower than this are generally too yellow to be used as a white reference, and the preference of most users is for whites that are substantially bluer than this limit. Placing the yellow-blue line 102 to the left of this point assures that the white, and many important near-neutral colors will fall into the BGY gamut. The green 92 and red 94 emitters have been placed to maximize color gamut within practical limits, and produce a gamut area of 0.1401 units in the u'v' color space. Slightly higher gamuts are possible by moving the yellow emitter 94 towards greener hues and green emitter 92 towards cyan hues, but this would carry the expense of higher power output and loss of important green colors in favor of cyan colors that occur less frequently during actual display use. Based upon this discussion, it is therefore preferred that the gamut of the display have an area of at least 0.14 units in the CIE 1976 u'v' chromaticity space. Such display gamuts will typically require red light-emitting elements with a dominant wavelength of 650 nm or greater. Generally, it will be preferred for the dominant wavelength of the red light-emitting element to be between 650 and 670 nm.

Figure 9:
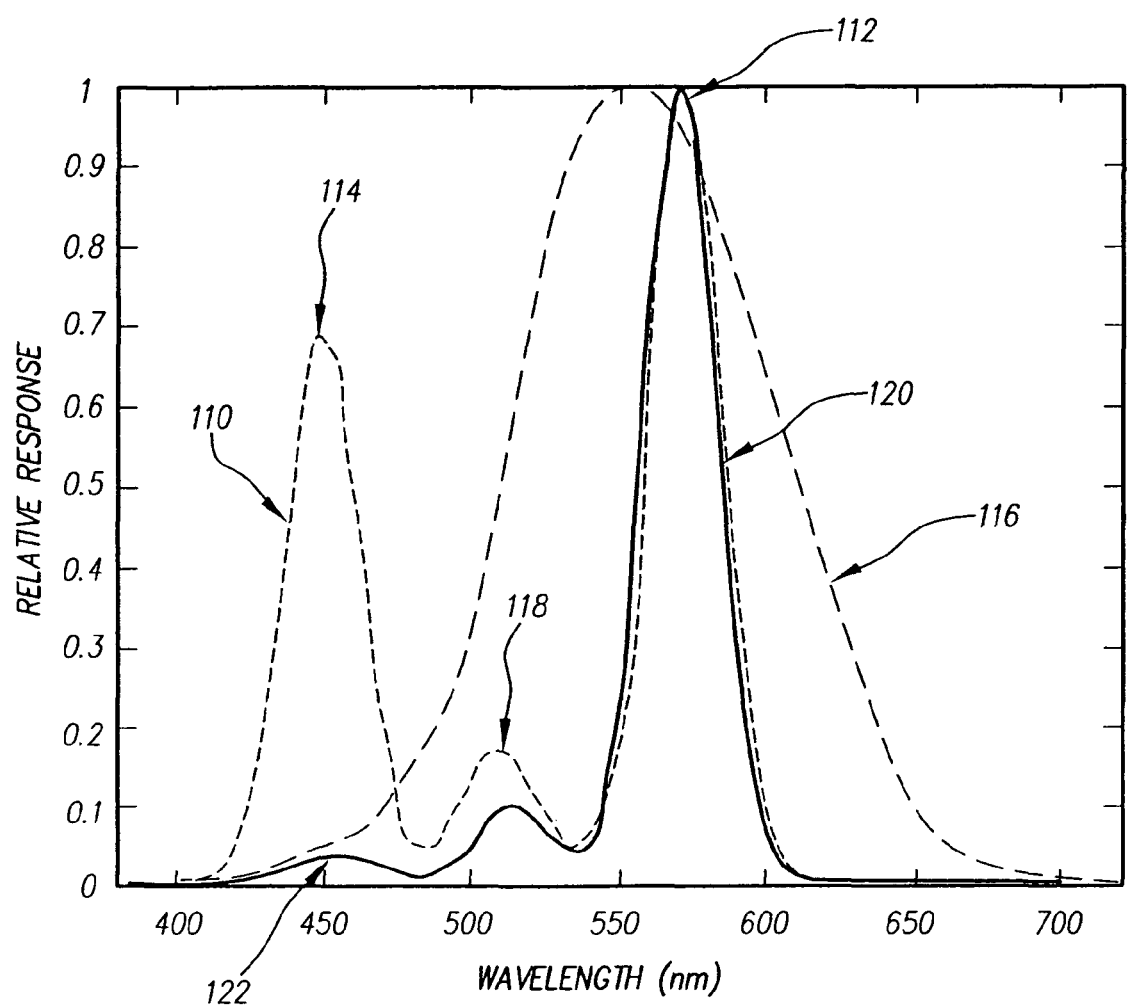
FIG. 9 is a plot of the relative radiance and luminance of a 6500K white, as compared to the human eye response, according to one embodiment of the present invention.

A significant characteristic of the preferred embodiment of the invention, as well as many other embodiments, is that the ratio of luminance output by the yellow-emitting element to the luminance output by the blue emitting element will be large. FIG. 9 demonstrates this by showing the relative radiometric output curve 110, which is the result of the combined output of the blue, green and yellow emitters that combine to form a 6500K white point. The three peaks correspond to the blue 114, green 118, and yellow 112 emitters. As expected, the yellow peak output is largest, followed by the blue, while the green is very small by comparison. When cascaded with the visual response curve 116, which is the same response curve shown in FIG. 1, and renormalized, the relative spectral luminance curve 120 results. When renormalized, this curve coincides with the radiometric curve 110 in the yellow, but departs from it in the green and blue where the eye is less sensitive. In luminance terms, the output of the blue emitter will be many times less than that of the yellow, having dropped from a peak 114 of around 70% of the yellow to a new peak 122 of less than 5% of the yellow. Placing most of the burden of the luminance output for neutral colors onto the yellow emitter results in greater display power efficiency.

Figure 10:
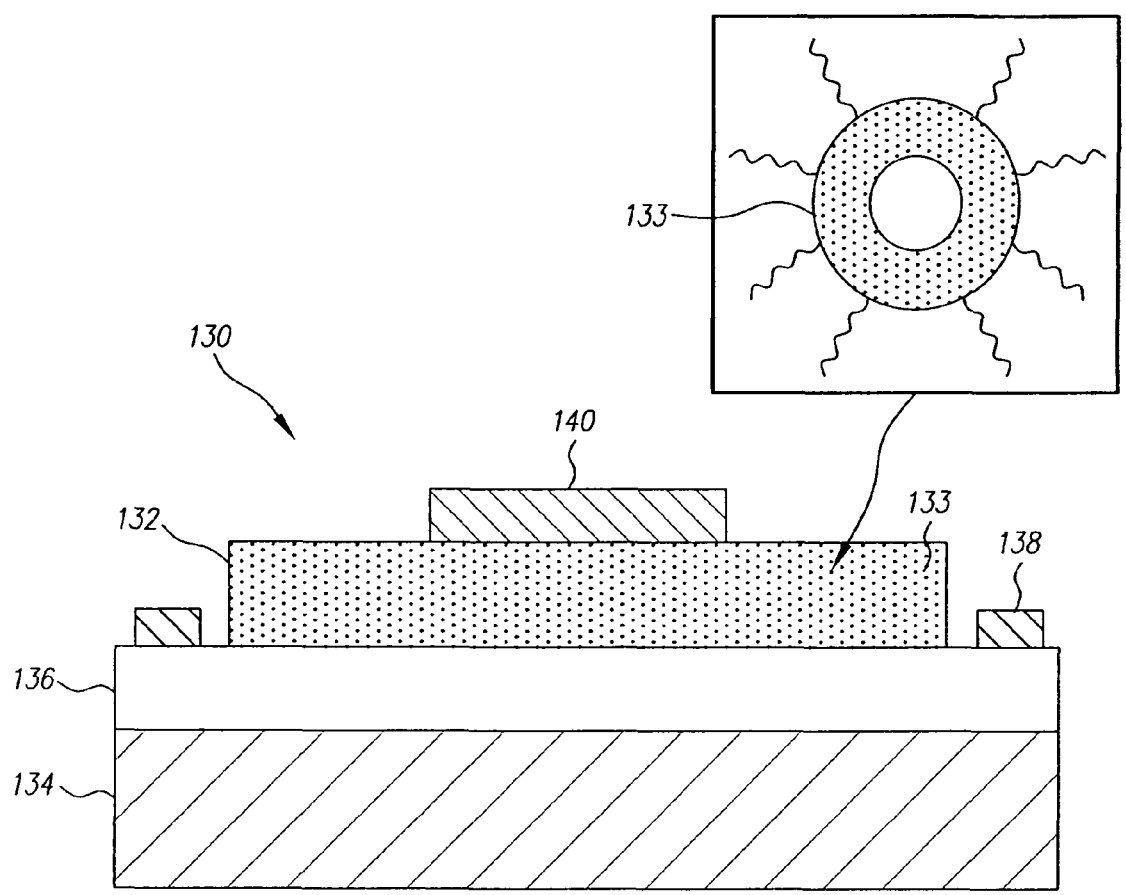
FIG. 10 is a cross-sectional view of a light-emitting element according to one embodiment of the present invention.

FIG. 10 shows a cross sectional view of a light-emitting element useful in practicing the present invention. As shown in this figure, the light-emitting element 130 incorporates an inorganic light-emitting layer 132 having quantum dots 133. A substrate 134 supports the deposited semiconductor and metal layers; its only requirements are that it is sufficiently rigid to enable the deposition processes and that it can withstand the thermal annealing processes (maximum temperatures of ~285° C.). The substrate can be transparent or opaque. Possible substrate materials are glass, silicon, metal foils, and some plastics. The next deposited material is an anode 136. For the case where the substrate 134 is p-type Si, the anode 136 is deposited on the bottom surface of the substrate 134. A suitable anode metal for p-Si is Al. It can be deposited by thermal evaporation or sputtering. Following its deposition, it will preferably be annealed at ~430° C. for 20 minutes. For all of the other substrate types named above, the anode 136 is deposited on the top surface of the substrate 134 and is comprised of a transparent conductor, such as, indium tin oxide (ITO). Sputtering or other well-known procedures in the art can deposit the ITO. The ITO is typically annealed at ~300° C. for one hour to improve its transparency. Because the sheet resistance of transparent conductors, such as, ITO, are much greater than that of metals, bus metal 138 can be selectively deposited through a shadow mask using thermal evaporation or sputtering to lower the voltage drop from the contact pads to the actual device. Inorganic light emitting layer 132 is deposited next. It can be dropped or spin cast onto the transparent conductor (or Si substrate). Other deposition techniques, such as, inkjetting the colloidal quantum dot-inorganic nanoparticle mixture is also possible. Following the deposition, the inorganic light-emitting layer 132 is annealed at a preferred temperature of 270° C. for 50 minutes. Lastly, a cathode 140 metal is deposited over the inorganic light-emitting layer 132. Candidate cathode 140 metals are ones that form an ohmic contact with the material comprising inorganic nanoparticles, such as quantum dots 133. For example, in a case where the quantum dots 133 are formed from ZnS inorganic nanoparticles, a preferred metal is Al. It can be deposited by thermal evaporation or sputtering, followed by a thermal anneal at 285° C. for 10 minutes. Those skilled in the art can also infer that the layer composition can be inverted, such that, the cathode 140 is deposited on the substrate 134 and the anode 136 is formed on the inorganic light emitting layer 132. In this configuration, when the substrate 134 is formed from Si, the substrate 134 is n-type Si.

Although not shown in FIG. 10, a p-type transport layer and an n-type transport layer may be added to the device to surround the inorganic light-emitting layer 132. As is well-known in the art, LED structures typically contain doped n- and p-type transport layers. They serve a few different purposes. Forming ohmic contacts to semiconductors is simpler if the semiconductors are doped. Since the emitter layer is typically intrinsic or lightly doped, it is much simpler to make ohmic contacts to the doped transport layers. As a result of surface plasmon effects, having metal layers adjacent to emitter layers results in a loss of emitter efficiency. Consequently, it is advantageous to space the emitter layers from the metal contacts by sufficiently thick (at least 150 nm) transport layers. Finally, not only do the transport layers inject electrons and holes into the emitter layer, but, by proper choice of materials, they can prevent the leakage of the carriers back out of the emitter layer. For example, if the inorganic quantum dots in the light-emitting layer 132 were composed of $ZnS_{0.5}Se_{0.5}$ and the transport layers were composed of ZnS, then the electrons and holes would be confined to the emitter layer by the ZnS potential barrier. Suitable materials for the p-type transport layer include II-VI and III-V semiconductors. Typical II-VI semiconductors are ZnSe, ZnS, or ZnTe. Only ZnTe is naturally p-type, while ZnSe and ZnS are n-type. To get sufficiently high p-type conductivity, additional p-type dopants should be added to all three materials. For the case of II-VI p-type transport layers, possible candidate dopants are lithium and nitrogen. For example, it has been shown in the literature that $Li_3N$ can be diffused into ZnSe at ~350° C. to create p-type ZnSe, with resistivities as low as 0.4 ohm-cm.

Suitable materials for the n-type transport layer include II-VI and III-V semiconductors. Typical II-VI semiconductors are ZnSe or ZnS. As for the p-type transport layers, to get sufficiently high n-type conductivity, additional n-type dopants should be added to the semiconductors. For the case of II-VI n-type transport layers, possible candidate dopants are the Type III dopants of Al, In, or Ga. As is well known in the art, these dopants can be added to the layer either by ion implantation (followed by an anneal) or by a diffusion process. A more preferred method is to add the dopant in-situ during the chemical synthesis of the nanoparticle. Taking the example of ZnSe particles formed in a hexadecylamine (HDA)/TOPO coordinating solvent, the Zn source is diethylzinc in hexane and the Se source is Se powder dissolved in TOP (forms TOPSe). If the ZnSe were to be doped with Al, then a corresponding percentage (a few percent relative to the diethylzinc concentration) of trimethylaluminum in hexane would be added to the syringe containing TOP, TOPSe, and diethylzinc. In-situ doping processes like these have been successfully demonstrated when growing thin films by a chemical bath deposition. It should be noted the diode could also operate with only a p-type transport layer or an n-type transport layer added to the structure. Those skilled in the art can also infer that the layer composition can be inverted, such that, the cathode 140 is deposited on the substrate 134 and the anode 136 is formed on the p-type transport layer. For the case of Si supports, the substrate 134 is n-type Si.

The light-emitting layer 132 will preferably be comprised of a plurality of light emitting cores, each core having a semiconductor material that emits light in response to recombination of holes and electrons, each such light emitting core defining a first bandgap; a plurality of semiconductor shells formed respectively about the light emitting cores to form core/shell quantum dots 133, each such semiconductor shell having a second bandgap wider than the first bandgap; and a semiconductor matrix connected to the semiconductor shells to provide a conductive path through the semiconductor matrix and to each such semiconductor shell and its corresponding light-emitting core so as to permit the recombination of holes and electrons.

Figure 11:
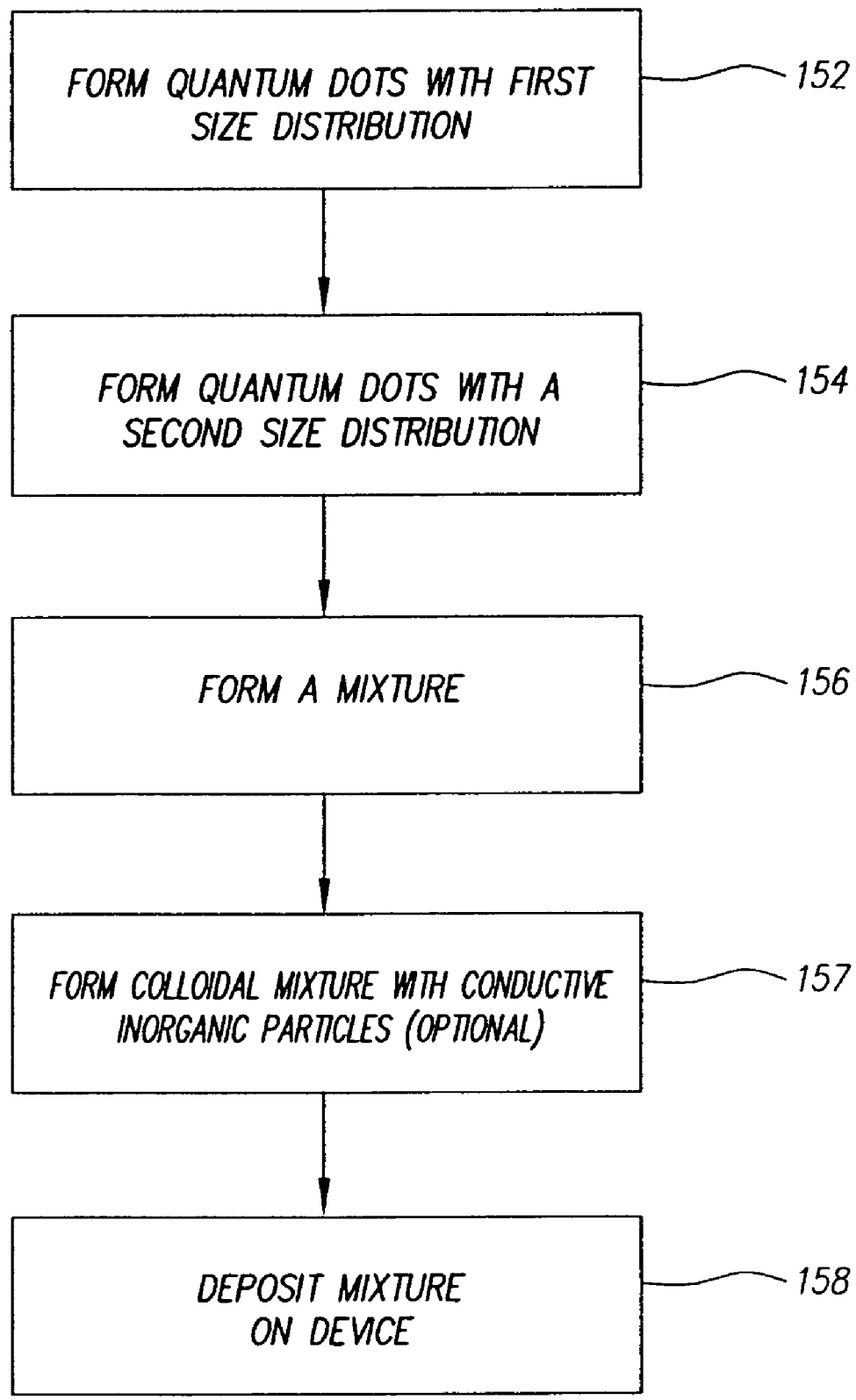
FIG. 11 is a process for forming a light-emitting layer, according to one embodiment of the present invention.

At least one of the two electrodes (i.e., anode 136 or cathode 140) will typically be formed of a transparent or semi-transparent material such as ITO or IZO. The opposing electrode will often be formed of a highly reflective material such as aluminum or silver, but may also be transparent. In a typical embodiment, the anode will be transparent and the cathode will be reflective, but the opposing structure is also viable. The hole and electron transport materials may be formed from inorganic semi-conducting materials as described above, and alternatively may also be formed from organic semi-conducting materials. Additional layers may also be placed into the structure to promote other functions, such as electron and hole injection from the electrodes; or electron or hole blocking layers to prevent electrons or holes from traveling past the light-emitting layer to recombine with oppositely charged particles near one of the electrodes. The creation of a light-emitting layer 132 comprised of quantum dots 133 for producing light with specific emission characteristics will generally involve synthesizing quantum dots 133 of a multiple sizes within separate steps and then depositing these quantum dots 133 in the correct proportion into the light-emitting layer 132 of a device. One process for fabricating such a layer is depicted in FIG. 11. In this process, a first size distribution of quantum dots will be formed in operation 152. One such process has been discussed in co-pending U.S. application Ser. No. 11/226,622, filed Sep. 14, 2005 by Kahen, which is hereby included by reference. A second size distribution of quantum dots will also be formed 154 using a similar process, but will result in different sizes by varying the parameters of the reaction (e.g., time, temperature, or concentrations) that are used to form the quantum dots. A mixture of the two distributions will then be formed 156 by combining the resulting quantum dots into a common material to form a mixture containing quantum dots from each of the two size distributions. This mixture will be contain a proportion of the number of quantum dots from the first size distribution to the number of dots from the second size distribution such that this proportion is approximately equal to the desired area under the desired spectral power distribution. An optional operation 157 of forming a colloidal mixture of the two distributions or sizes of quantum dots with additional conductive inorganic particles may be performed. These additional conductive inorganic particles can, in some embodiments, be useful in forming a semi-conductor matrix, promoting the flow of holes and electrons to the quantum dots. Once this mixture of quantum dots is formed, the quantum dot mixture is deposited in operation 158 onto the device using conventional means.

In preferred embodiments of this method at least one of the first and second electrodes will be transparent or semi-transparent and the light-emitting materials will be comprised of inorganic light-emitting particles. Further, the step of forming a light-emitting layer over the first electrode may include coating at least one common inorganic transport layer within the area of each of the light-emitting elements. In some embodiments, the step of forming a light-emitting layer further will further include coating at least one common inorganic transport layer over the first electrode prior to coating the electroluminescent materials and forming at least a second common inorganic transport layer over the electroluminescent materials, prior to forming the second electrode. Typically one of these inorganic transport layers will be an n-type transport layer for aiding the injection of electrons and the other will be a p-type transport layer for aiding the injection of holes.

Figure 12:
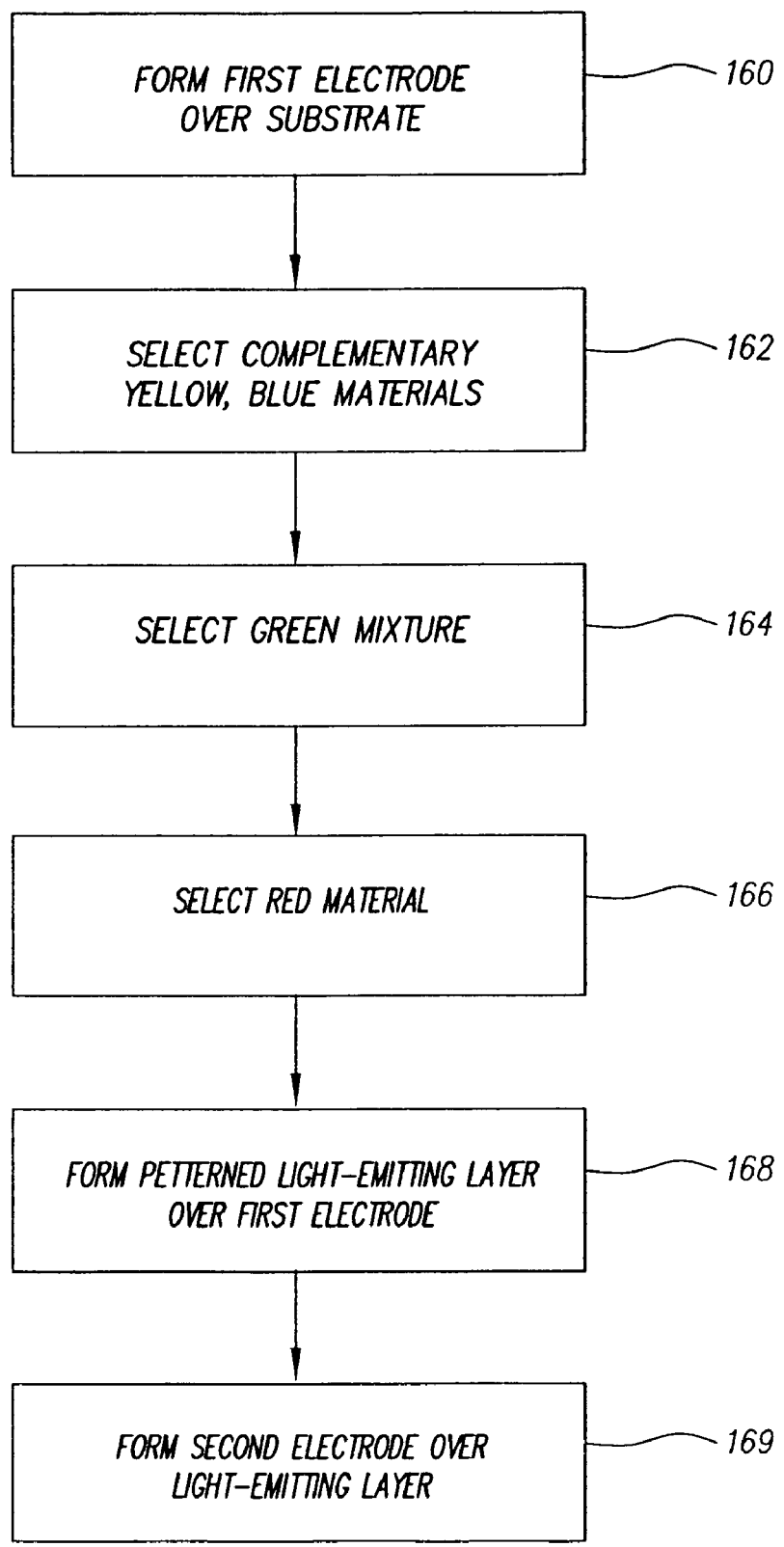
FIG. 12 is a process for making a display device, according to one embodiment of the present invention.

In accord with the present invention and with reference to FIG. 12, a method of making a color electroluminescent display comprises the steps of: forming 160 a first electrode over a substrate; selecting 162 at least two different electroluminescent materials that provide substantially complementary yellow and blue light emission, having chromaticity coordinates that define endpoints of a line that intersects a Planckian locus within the interval $0.175<=u'<=0.225$ within CIE 1976 u' v' chromaticity space; selecting 164 a green electroluminescent material having a dominant wavelength between 490 nm and 540 nm and a full width, half maximum spectral bandwidth of 50 nm or less; selecting 166 a red electroluminescent material; forming 168 a light-emitting layer over the first electrode, wherein the light-emitting layer is formed as a patterned array of the yellow, blue, green, and red electroluminescent materials; and forming 169 a second electrode over the light-emitting layer. Note that in this method, at least one of the two electrodes is preferably patterned and aligned to the patterned array of the yellow, blue, green, and red electroluminescent materials to form the light-emitting elements. Herein alignment of the patterned electrodes to the electroluminescent materials means that the array of patterned electrodes is vertically stacked with respect to the patterned array of electroluminescent material, such that the area of each electrode in the electrode layer lies within the corresponding perimeter of each corresponding luminescent area in the electroluminescent material layer. Also note, that in any display application at least one of the first and second electrodes is patterned along at least one dimension. In active matrix displays, typically only one of these electrodes will be patterned, but it will be patterned in two dimensions. In passive matrix displays, the two electrodes will each be patterned along a single dimension, typically forming an orthogonal grid.

Figure 13:
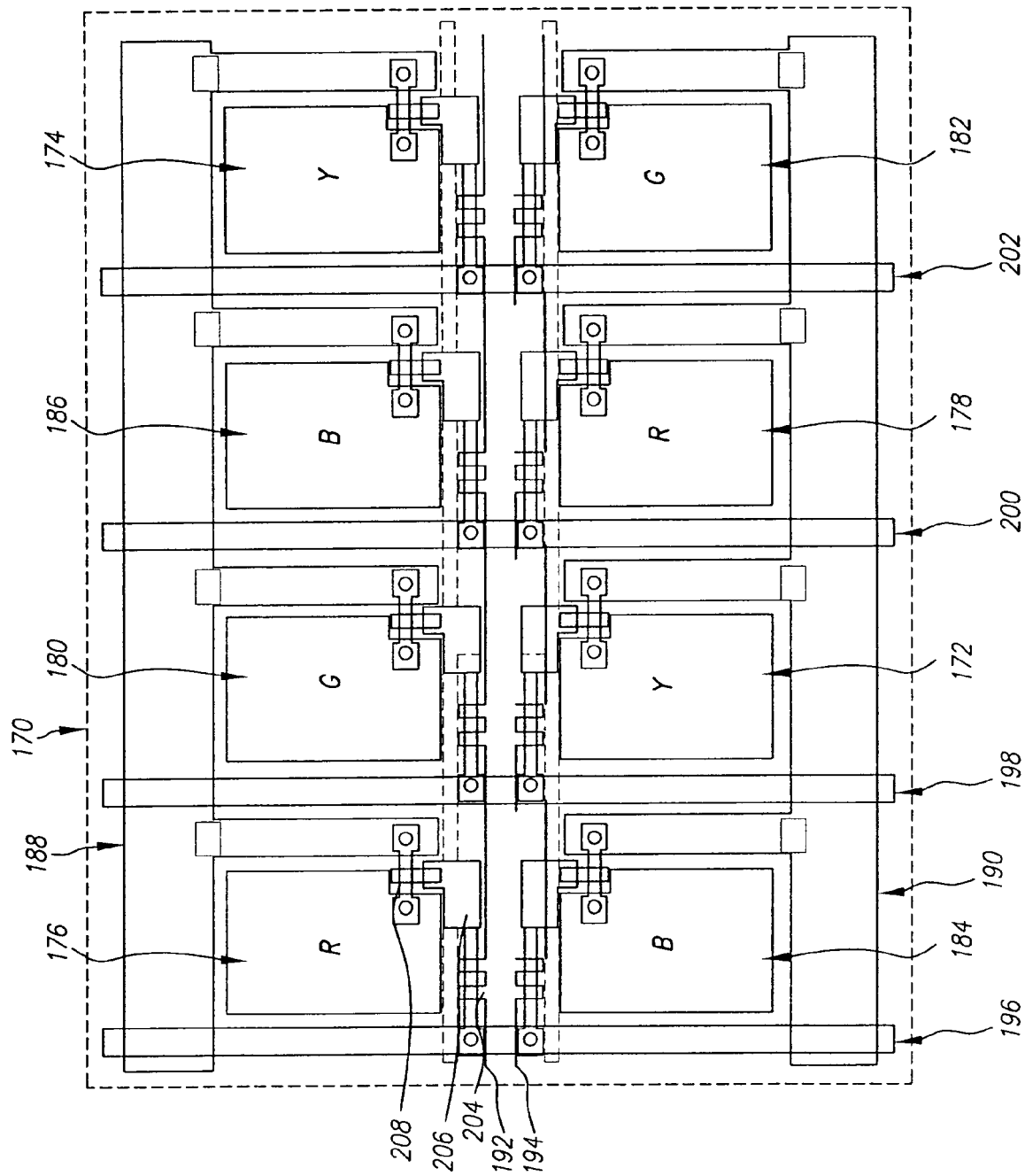
FIG. 13 is an array of light-emitting elements, according to one embodiment of the present invention.

Within a full-color display, the light-emitting elements will typically be patterned beside each other as depicted in FIG. 13. As shown in this figure, such a full-color display will have an array of light-emitting elements that emit red light 176, 178, green light 180, 182, blue light 184, 186 and yellow light 172, 174. While the portion 170 of the full-color display as shown in FIG. 13 applies active matrix circuitry to drive the light-emitting elements of the display device, the display device may also apply passive-matrix circuitry.

As shown in FIG. 13, active matrix circuitry for driving a device of the present invention will typically include power lines 188, 190 for providing current to the light-emitting elements, select lines 192, 194 for selecting a row of circuits, drive lines 196, 198, 200, 202 for providing a voltage to control each of the circuits, select TFTs 204 for allowing the voltage for a drive line 196, 198, 200, 202 to be provided only to the light-emitting elements in a column that receive a select signal on a select line 192 or 194, a capacitor 206 for maintaining a voltage level between each line refresh and a power TFT 208 for controlling the flow of current from the power lines 188, 190 to one of the electrodes for each light-emitting element.

Figure 14:
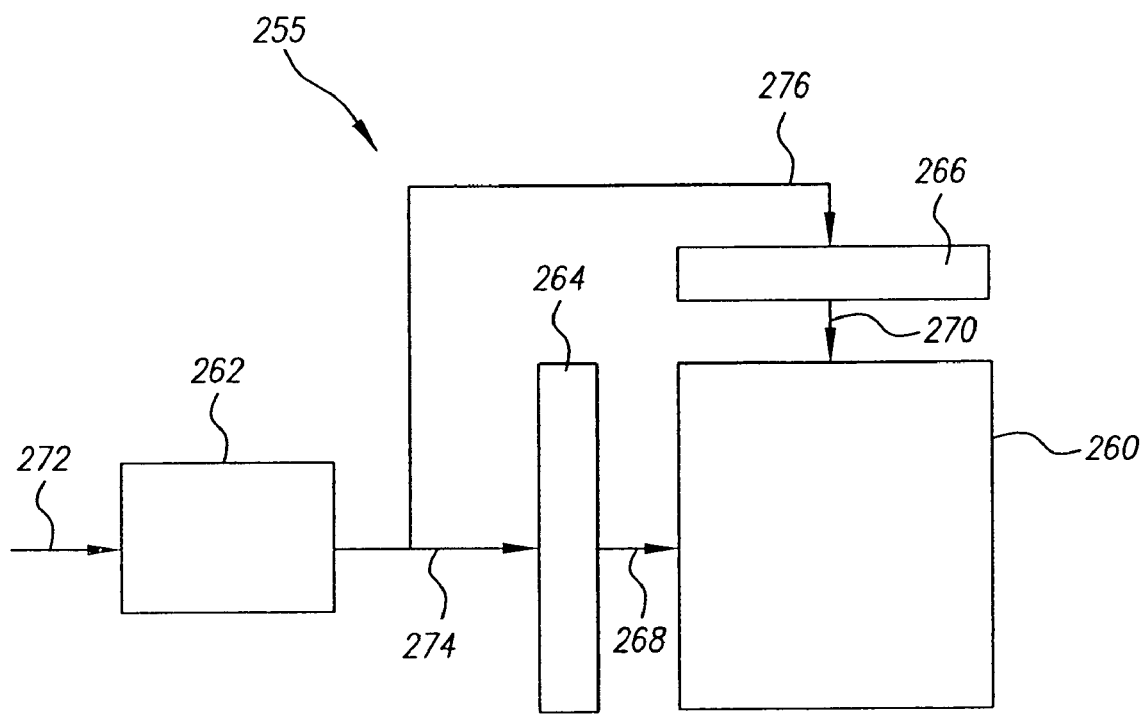
FIG. 14 is a display system, according to one embodiment of the present invention.

The full color display of the present invention may be employed within a display system 255 as shown in FIG. 14. As shown in FIG. 14, such a display system includes a display 260, according to one embodiment of the present invention. As described previously, the display 260 has at least four differently colored light-emitting elements, including complementary yellow and blue light-emitting elements, the chromaticity coordinates of which define the endpoints of a line passing within ±0.025 u' units of the line u'=0.2 in the Commission Internationale de l'Eclairage (CIE) 1976 u' v' chromaticity space. Further, the display 260 employs a green light-emitting element of spectrum having a dominant wavelength between 500 nm and 540 nm and a full width, half maximum spectral bandwidth of 50 nm or less, as well as a red light-emitting element. One display controller 262, is electrically connected to the light-emitting elements. During operation, the controller 262 provides appropriate row 268 and column 270 signals to the display 260. Typically, the display system 255 will further include a row driver 264, and a column driver 266. A controller 262 will typically receive an input digital RGB signal 272 for the image that is to be displayed and convert this signal to provide a synchronization signal 274 to row driver 264 and a four color signal 276 to column driver 266 for driving the four light-emitting elements. Through this process, the controller 262 applies a drive signal to the light-emitting elements in a way that the yellow and blue light-emitting elements will be preferentially applied in the place of combinations of the red, green, and blue light-emitting elements when forming near-neutral colors. This preferential conversion will allow the display system 255 to improve the luminous efficiency of the display 260 while maintaining a large color gamut. Methods for performing this conversion are known in the art and include processes such as described in co-pending US Application US20050212728A1 by Miller et al., included herein by reference. Generally, these methods include subtracting a portion of the red, green, and blue code values which would form the color of the yellow light-emitting element from these input code values, and assigning some proportion of this same value to the drive value of the yellow light-emitting elements. In this way, the highly efficient yellow light-emitting elements are preferentially employed to produce luminance that would have otherwise been primarily produced by the red and green light-emitting elements, which typically have lower luminance efficiency. Once this signal is received, row driver 264 and column driver 266 will then provide select signals 268 on the select lines 192, 194 and drive signals 270 on the drive lines 196, 198, 200, 202 to the display 260.

Figure 15:
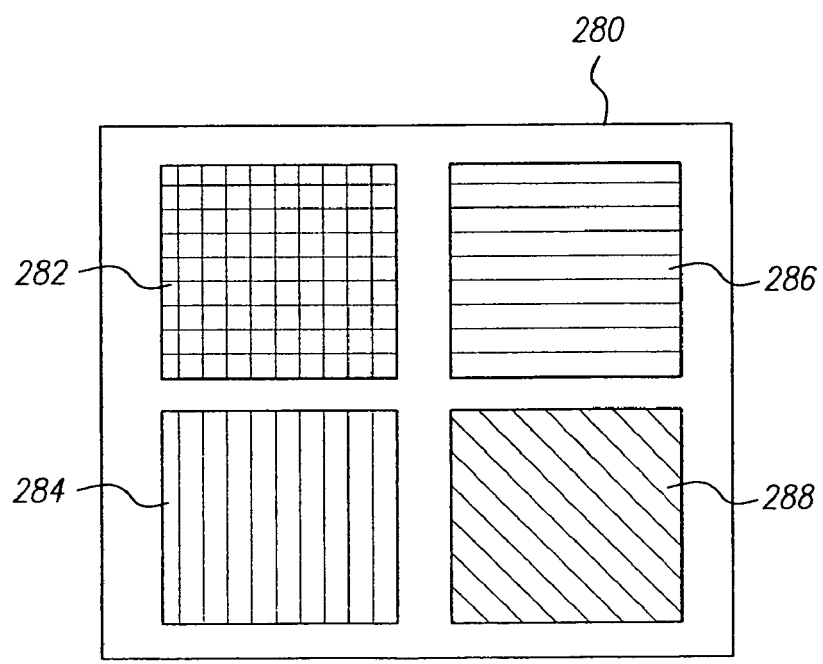
FIG. 15 is an arrangement of light-emitting elements, according to one embodiment of the present invention.

It should be noted, that the full-color display shown in FIGS. 13 and 14 has one particular arrangement of light-emitting elements useful in practicing the present invention. Many other similar arrangements are known in the art such as described in the Miller application, and in US Application US20050270444A1 by Miller et al., herein included by reference. One additional exemplary arrangement is a quad arrangement of light-emitting elements, such as the arrangement shown in FIG. 15. This figure shows a portion of a display 280 comprising a single arrangement of four light-emitting elements 282, 284, 286, 288, which may be tiled across the entire display surface, wherein the four light-emitting elements are arranged as squares within a square. These light-emitting elements will be comprised of a yellow light-emitting element 282 and will also include light-emitting elements for emitting red 284, green 288, and blue 286 light. Although one arrangement of the four elements are shown in this figure, it should be recognized that these four colored light-emitting elements may be arranged in any order within the repeating pattern. Further, alternative arrangements may be employed within neighboring repeating patterns.

The invention has been described in detail with particular reference to certain preferred embodiments thereof, but it will be understood that variations and modifications can be effected within the spirit and scope of the invention.

PARTS LIST

- 2 peak eye sensitivity
- 4 short wavelength
- 6 long wavelength
- 8 color gamut triangle
- 10 color gamut triangle
- 12 spectrum locus
- 14 red emissive element
- 16 green emissive element
- 18 blue emissive element
- 20 model emitter spectrum
- 22 full-width-half-maximum
- 24 peak value
- 26 dominant wavelength
- 30 spectrum locus
- 32 u'v'locus, FWHM=30 nm
- 34 u'v'locus, FWHM=50 nm
- 36 u'v'locus, FWHM=80 nm
- 40 luminous efficacy vs. dominant wavelength, FWHM=1 nm
- 42 luminous efficacy vs. dominant wavelength, FWHM=10 nm
- 44 luminous efficacy vs. dominant wavelength, FWHM=30 nm
- 46 luminous efficacy vs. dominant wavelength, FWHM=50 nm
- 48 luminous efficacy vs. dominant wavelength, FWHM=80 nm
- 50 Planckian Locus
- 52 5000K white point
- 54 6500K white point
- 56 9300K white point
- 58 locus of blue emitters
- 60 locus of yellow emitters
- 62 locus of green emitters
- 64 lines connecting blue and yellow emitters
- 70 light-emitting element at 450 nm
- 72 light-emitting element at 525 nm
- 74 light-emitting element at 570 nm
- 76 light-emitting element at 650 nm
- 78 line connecting blue and yellow light-emitting elements
- 80 near-white color
- 82 blue color
- 90 light-emitting element at 450 nm
- 92 light-emitting element at 510 nm
- 94 light-emitting element at 572 nm
- 96 light-emitting element at 650 nm
- 100 line connecting blue and yellow light-emitting elements
- 102 near-white color
- 110 relative radiometric output curve
- 112 peak of yellow radiometric output
- 114 peak of blue radiometric output
- 116 visual response curve
- 118 peak of green radiometric output
- 120 relative spectral luminance curve
- 122 peak of yellow luminance output
- 130 light-emitting element
- 132 inorganic light-emitting layer
- 133 quantum dots
- 134 substrate
- 136 anode
- 138 bus
- 140 cathode
- 152 process step: form first size distribution of quantum dots
- 154 process step: form second size distribution of quantum dots
- 156 process step: form mixture of two distributions
- 157 optional process step: form colloidal mixture of quantum dots with additional conductive inorganic particles
- 158 process step: deposit quantum dot mixture onto device
- 160 process step: form first electrode over substrate
- 162 process step: select complementary yellow and blue materials
- 164 process step: select green material
- 166 process step: select red material
- 168 process step: form patterned light-emitting layer over first electrode
- 169 process step: form second electrode over light-emitting layer
- 170 portion of a full-color display
- 172, 174 yellow light-emitting elements
- 176, 178 red light-emitting elements
- 180, 182 green light-emitting elements
- 184, 186 blue light-emitting elements
- 188, 190 power lines
- 192, 194 select lines
- 196, 198, 200, 202 drive lines
- 204 select TFTs
- 206 capacitor
- 208 power TFT
- 255 display system
- 260 display
- 262 display controller 264 row driver
266 column driver
268 row signal
270 column signal
272 RGB signal
274 synchronization signal
276 four color signal
280 portion of a display
282 yellow light-emitting element
284 red light-emitting element
286 blue light-emitting element
288 green light-emitting element

What is claimed is:

1. A full-color electroluminescent display with improved efficiency and increased color gamut, comprising:
   a. substantially complementary yellow and blue light-emitting elements, the chromaticity coordinates of which define the endpoints of a line that intersects a Planckian locus within the interval $0.175<=u'<=0.225$ within the Commission Internationale de l'Eclairage (CIE) 1976 u'v' chromaticity space;
   b. a green light-emitting element of spectrum having a dominant wavelength between 500 nm and 540 nm and a full width, half maximum spectral bandwidth of 50 nm or less; and
   c. a red light-emitting element.

2. The color electroluminescent display device of claim 1, wherein combinations of the substantially complementary yellow and blue light-emitting elements, which lie along the line in the CIE chromaticity space, produce any colors along the line between them with greater luminous efficiency than other combinations of the four light-emitting elements (red, green, yellow, and blue).

3. The color electroluminescent display device of claim 1, wherein the red and green light-emitting elements have emission characteristics that are selected to produce a display having a color gamut of at least 0.14 units in the CIE 1976 u'v' chromaticity space.

4. The color electroluminescent display device of claim 1, wherein the blue light-emitting element emits light having a dominant wavelength between 440 and 460 nm.

5. The color electroluminescent display device of claim 1, wherein the yellow light-emitting element emits light having a dominant wavelength between 565 and 575 nm.

6. The color electroluminescent display device of claim 1, wherein the yellow light-emitting element produces a peak luminance of at least 20 times a peak luminance produced by the blue light-emitting element when forming a 6500K white point.

7. The color electroluminescent display device of claim 1, wherein the red light-emitting element emits light having a dominant wavelength between 650 nm and 670 nm.

8. The color electroluminescent display device of claim 1, wherein the light-emitting elements are formed from different species of inorganic light-emitting particles, each species emitting a different color of light, the electroluminescence spectrum of each species having a full-width half maximum of 50 nm or less.

9. The color electroluminescent display device of claim 8, wherein the spectrum of each species further has full-width half maximum of 30 nm or less.

10. The color electroluminescent display device of claim 8, wherein the inorganic light-emitting particles are quantum dots and wherein emission characteristics of the light-emitting elements are altered by forming quantum dots of different sizes.

11. A method of making a color electroluminescent display device, comprising the steps of:
   a. forming a first electrode over a substrate;
   b. selecting at least two different electroluminescent materials that provide substantially complementary yellow and blue light emission, having chromaticity coordinates that define endpoints of a line that intersects a Planckian locus within the interval $0.175<=u'<=0.225$ within CIE 1976 u'v' chromaticity space;
   c. selecting a green electroluminescent material having a dominant wavelength between 500 nm and 540 nm and a full width, half maximum spectral bandwidth of 50 nm or less;
   d. selecting a red electroluminescent material;
   e. forming a light-emitting layer over the first electrode, wherein the light-emitting layer is formed as a patterned array of the yellow, blue, green, and red electroluminescent materials; and
   f. forming a second electrode over the light-emitting layer, wherein at least one of the first or second electrodes are patterned, and are aligned to the patterned array of the yellow, blue, green, and red electroluminescent materials to form light-emitting elements.

12. The method claimed in claim 11, wherein at least one of the first and second electrodes is transparent or semi-transparent.

13. The method claimed in claim 11, wherein each of the light-emitting materials are comprised of inorganic light-emitting particles.

14. The method claimed in claim 13, wherein the step of forming a light-emitting layer over the first electrode, further comprises forming a colloidal mixture of the inorganic light-emitting particles and an additional electrically conductive particle.

15. The method of making the light-emitting device of claim 11, wherein the step of forming the light-emitting layer over the first electrode further comprises coating at least one common inorganic transport layer within the area of each of the light-emitting elements.

16. The method of making the light-emitting device of claim 11, wherein the step of forming a light-emitting layer further comprises coating at least one common inorganic transport layer over the first electrode prior to coating the electroluminescent materials and forming at least a second common inorganic transport layer over the electroluminescent materials, prior to forming the second electrode.

17. A color electroluminescent display system having at least four differently colored light-emitting elements, comprising:
   a. substantially complementary yellow and blue light-emitting elements having chromaticity coordinates that define endpoints of a line that intersects a Planckian locus within the interval $0.175<=u'<=0.225$ within the Commission Internationale de l'Eclairage (CIE) 1976 u'v' chromaticity space;
   b. a green light-emitting element of spectrum having a dominant wavelength between 500 nm and 540 nm and a full width, half maximum spectral bandwidth of 50 nm or less;
   c. a red light-emitting element; and
   d. a controller that is electrically connected to the light-emitting elements and that selectively applies a drive signal to the light-emitting elements to preferentially apply the yellow and blue light-emitting elements when forming near-neutral colors to improve the luminous efficiency of the display while maintaining a large color gamut.

* * * * *